United States Patent
Uebayashi et al.

(10) Patent No.: US 6,867,507 B2
(45) Date of Patent: Mar. 15, 2005

(54) LEAD FRAME

(75) Inventors: Tetsuya Uebayashi, Tokyo (JP); Shunichi Abe, Tokyo (JP); Naoki Izumi, Tokyo (JP); Akira Yamazaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/256,006

(22) Filed: Sep. 27, 2002

(65) Prior Publication Data

US 2003/0062604 A1 Apr. 3, 2003

(30) Foreign Application Priority Data

Sep. 28, 2001 (JP) ........................................ 2001-299162

(51) Int. Cl.[7] ............................................. H01L 23/544
(52) U.S. Cl. ...................... 257/797; 257/666; 257/667; 257/668
(58) Field of Search ........................ 257/797, 666–668

(56) References Cited

U.S. PATENT DOCUMENTS

| | | | | |
|---|---|---|---|---|
| 4,642,672 A | * | 2/1987 | Kitakata | 257/797 |
| 5,643,835 A | * | 7/1997 | Chia et al. | 29/827 |
| 6,072,228 A | * | 6/2000 | Hinkle et al. | 257/666 |
| 6,577,019 B1 | * | 6/2003 | Roberts et al. | 257/797 |
| 2001/0028553 A1 | * | 10/2001 | Allen | 361/711 |
| 2002/0053748 A1 | * | 5/2002 | Tanaka et al. | 257/797 |
| 2002/0076853 A1 | * | 6/2002 | Kramer et al. | 438/113 |
| 2002/0185753 A1 | * | 12/2002 | Werner et al. | 257/797 |

FOREIGN PATENT DOCUMENTS

| | | |
|---|---|---|
| JP | 62-163962 | 10/1987 |
| JP | 05-343469 | 12/1993 |
| JP | 06-291241 | 10/1994 |

* cited by examiner

*Primary Examiner*—Long Pham
*Assistant Examiner*—Nathan W. Ha
(74) *Attorney, Agent, or Firm*—McDermott Will & Emery LLP

(57) ABSTRACT

A section of predetermined geometry and area is provided on or in a die pad of a lead frame and taken as a mark to be used for checking the position of a semiconductor chip. If the semiconductor chip is placed outside an allowable range in the X direction, the semiconductor chip overlaps the mark, thereby changing the geometry of an observable portion (slanted portion) of the mark. By means of the change, a positional deviation of the semiconductor chip in the X direction can be ascertained. A positional deviation of the semiconductor chip in Y direction is determined, by observing whether or not an electrode is situated between extensions of sides of a certain portion of the section.

15 Claims, 5 Drawing Sheets

LEAD FRAME

BACKGROUND OF THE INVENTION

1. Field of the Invention

The present invention relates to a lead frame for mounting a semiconductor chip. More particularly, the invention relates to marks to be used for ascertaining the position of a semiconductor chip when the chip has been mounted on a lead frame.

2. Background Art

A lead frame is one type of semiconductor packaging material. A lead frame is constituted of a die pad on which a semiconductor chip is to be mounted, and a plurality of lead patterns to be used for electrically connecting the semiconductor chip with a circuit disposed outside a package. A semiconductor package is completed by the steps of: mounting a semiconductor chip on a die pad of a lead frame; bonding the chip to the die pad of the lead frame with an adhesive, such as resin or solder, to thereby connect leads with electrodes of the semiconductor chip by means of bonding wires; and filling the lead frame with resin sealing material after the leads have been processed.

In order to facilitate bonding operation, a semiconductor chip is desirably placed as accurately as possible in a specified position on a die pad. To this end, an operator aligns a semiconductor chip with a position while viewing a distance between the edge of the die pad and the semiconductor chip by use of a microscope. In order to facilitate the work, there has been proposed a method of forming dot-shaped marks in the neighborhoods of locations where the four corners of a semiconductor chip are to be positioned. The inventors who have filed Japanese Patent Application Laid-Open No. 291241/1994 propose a method of mark a die pad with mesh-shaped lines.

The position of a semiconductor chip is checked not only when a semiconductor chip is to be mounted on a die pad, but also in an inspection process after the semiconductor chip has been fixed to the die pad. When a mounted position is checked in the inspection process, a determination must be made as to whether or not positional accuracy has satisfied a predetermined specification. FIG. 10 is a view for describing the determination method, showing a semiconductor chip 3 mounted on a die pad 5 of a lead frame 2 when viewed from the top. As illustrated, according to the conventional method, after the semiconductor chip 3 has been mounted, an inspection operator uses a microscope to determine a distance L1 between the edge of the die pad 5 and the edge of the semiconductor chip 3 with respect to direction Y, and a distance L2 between the edge of the die pad 5 and the edge of the semiconductor chip 3 with respect to direction X. On the basis of the thus-determined distances, the inspection operator makes a determination as to whether or not the accuracy of a mounted position of the semiconductor chip has satisfied a predetermined specification.

The above-described measurement imposes a great workload on the inspection operator and is unsuitable for a mass-production process. Moreover, a measurement method varies according to the geometry of a die pad, so that an inspection operator must learn a new measurement method for each type of die pad.

Measurement of a distance relative to the edge of the die pad is based on the premise that a semiconductor chip is smaller than a die pad. For this reason, if a semiconductor chip is mounted on a die pad which is smaller in width than the chip, appropriate inspection and evaluation operations cannot be performed.

SUMMARY OF THE INVENTION

The present invention aims at enabling an easy check as to whether or not the accuracy of a mounted position of a semiconductor chip satisfies specifications, without involvement of measurement.

A lead frame of the present invention has a die pad on which a semiconductor chip is to be mounted, and the die pad includes one or more sections in a certain shape or shapes which have predetermined geometry and area used to check a mounted position of the semiconductor chip.

The section has geometry and area (in a word the section is neither a dot nor a line). When a semiconductor chip overlaps the section, geometry of an observable portion of the section varies in accordance with the mounted position of the semiconductor chip. Consequently, the positional deviation can be readily ascertained as a change in the geometry of the observable portion of the section.

The section is preferably formed as a through hole. There can be prevented occurrence of well voids, which would otherwise arise in a resin injection process.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

First Embodiment

Figure 1A:
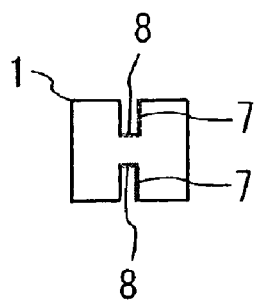
FIG. 1A shows a section used to check a mounted position of the semiconductor chip according to a first embodiment of the present invention.

The present embodiment relates to a mark, which is formed as a section of a lead frame, having the shape of the letter H and is to be used for ascertaining the mounted position of a semiconductor chip. FIG. 1A shows the geometry of a mark 1. As illustrated, the mark 1 has the geometry of the letter H formed by a combination of rectangles of predetermined lengths and widths. The mark 1 is formed in a lead frame 2 in the form of a through hole.

Figure 1B:
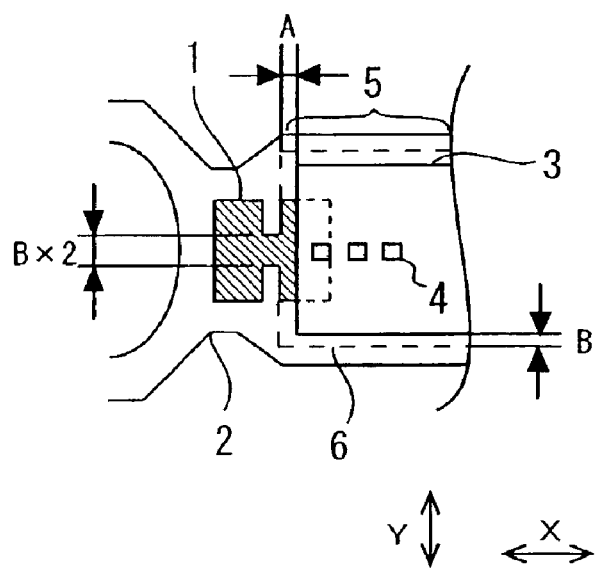
FIG. 1B is a plan view of the lead frame having the section in FIG. 1A, and a semiconductor chip mounted thereon.

FIG. 1B is a plan view of the lead frame 2 having the mark 1 formed therein, and a semiconductor chip 3 mounted thereon. The semiconductor chip 3 is situated at a specified center position on a die pad 5. Aluminum electrodes 4 are formed on the semiconductor chip 3 and can be visually ascertained when the semiconductor chip 3 is observed under a microscope from above. As will be described later, in the embodiment, the electrode 4 located in the vicinity of the left edge of the semiconductor chip 3 is used for ascertaining the position of the semiconductor chip 3. An electrode to be used for positional check may be selected in accordance with the position of the electrode on a chip and the geometry of the mark 1, as required.

An allowable mount range 6 is defined on the die pad 5. Dotted lines in the drawing are used for illustrating the allowable mount range 6, and in reality the allowable mount range 6 cannot be viewed. The allowable mount range is set to, e.g., an allowable positional deviation value on the order of micrometers or in terms of a certain percentages of the size of a semiconductor chip, by a predetermined standard. The following descriptions are based on the assumption that a positional deviation of distance A in the X direction and a positional deviation of distance B in the Y direction are allowed. Allowable positional deviation values A, B are usually several hundred of micrometers. If the semiconductor chip 3 is mounted within the allowable mount range 6, the semiconductor package is determined to be nondefective. If the semiconductor chip 3 is mounted outside the allowable mount range 6, the semiconductor package is determined to be defective.

The mark 1 is arranged such that sides 7 shown in FIG. 1A from among sides constituting the mark 1 are aligned with a left border line of the allowable mount range 6 in the manner shown in FIG. 1B. As shown in FIG. 1B, the mark 1 is disposed such that the centers of the electrodes 4 and the center of the mark 1 are arranged in line with each other. Further, sides 8 from among the sides constituting the mark 1 are arranged to correspond to the allowable positional deviation limit of the electrode 4 in the Y direction. Here, the magnitude of positional deviation of the electrode 4 directly corresponds to the magnitude of positional deviation of the semiconductor chip. Consequently, in the case of the embodiment shown in FIG. 1B, the width of a lateral rectangle (i.e., a horizontal portion of the H-shaped mark 1) is twice the allowable positional deviation value B.

In a case where the mark 1 has the geometry shown in FIG. 1A and is arranged in the manner as shown in FIG. 1B, the mark 1 is viewed from above as a letter H when the semiconductor 3 is mounted appropriately within the allowable mount range 6. However, if the semiconductor chip 3 is deviated toward the left in the X direction by a distance greater than the distance A, the mark 1 will be viewed from above as a shape analogous to the lying letter T or as a rectangle which is long in the Y direction. In short, a deviation in the mounted position of the semiconductor chip 3 can be ascertained as a change in the geometry of the mark 1. This method enables an easy, at-a-glance determination as to whether or not the magnitude of deviation falls within the allowable range, with the shape of an observable portion of the mark 1 and without involvement of measurement of a distance from the edge of a die pad or a mark serving as a reference to a semiconductor chip.

There will now be described a method of ascertaining positional deviation in the Y direction. The mounted position of the semiconductor chip 3 in the Y direction is ascertained on the basis of a positional relationship between the mark 1 and the electrode 4. As mentioned previously, in the present embodiment, the positions of the sides 8 of the mark 1 represent the positional limit of the electrode 4 in the Y direction. Consequently, if the electrode 4 is situated at a position between extensions of the two sides 8, the position of the semiconductor chip 3 in the Y direction can be determined to fall within the allowable range 6.

Figure 2:
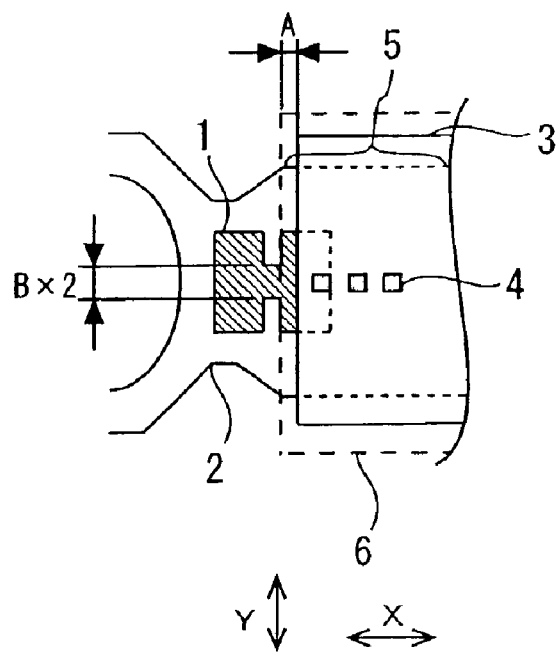
FIG. 2 is a plan view of the lead frame having the section in FIG. 1A, and a semiconductor chip which is larger in width than the die pad mounted thereon.

The positional deviation of the semiconductor chip 3 in the Y direction can also be ascertained by means of forming a mark identical with the mark 1 in the Y direction. However, as in the case of the present embodiment, if the position of the semiconductor chip 3 in the Y direction is observed in consideration of the positional relationship between the electrode 4 and the mark 1, there is obviated a necessity of taking the edge of the semiconductor chip 3 as a reference. As shown in FIG. 2, the invention can also be applied to the semiconductor chip 3 when the semiconductor chip 3 is larger in width than the die pad 5.

That is, according to another aspect of the present invention, two methods of checking a position of a semiconductor chip mounted on a lead frame are proposed. First method includes the steps of: defining, on the lead frame, an allowable range for mounting a semiconductor chip determined on the basis of predetermined specifications; forming, on or in the lead frame, one or more sections in a certain shape or shapes which have predetermined geometry and area disposed outside the allowable range so as to be bordered by a borderline of the allowable range or such that at least one of sides constituting the section coincides with the borderline; observing the section from above a semiconductor chip mounted on the lead frame; and checking the position of the semiconductor chip on the basis of geometry of an observable portion of the section, which varies in accordance with the mounted position of the semiconductor chip.

Second method of checking a position of a semiconductor chip mounted on a lead frame includes the steps of: forming, on or in the lead frame, one or more sections in a certain shape or shapes which have predetermined geometry and area such that a predetermined portion of the section is equal in size with a positional deviation allowed for the semiconductor chip on the lead frame on the basis of predetermined specifications, and defining a characteristic portion of the semiconductor chip as an object of observation; and checking the position of the semiconductor chip, by checking the position of the object on the lead frame while the predetermined portion of the section is taken as a reference.

As mentioned above, in the present embodiment, when the mounted position of the semiconductor chip 3 is ascertained through observation under a microscope, a determination can be made at a glance as to whether or not the positional deviation of the semiconductor chip 3 in the X direction has exceeded an allowable range, by means of the geometry of an observable portion of the mark 1. Further, a determination can be readily made as to whether or not the positional deviation of the semiconductor chip 3 in the Y direction falls within the allowable range, by means of a comparison between the electrode 4 and a predetermined portion of the mark 1. In other words, a determination can be made as to whether or not the accuracy of mounted position of a semiconductor chip satisfies specifications, without involvement of measurement of a distance between the edge of a die pad and the edge of the semiconductor chip, which has hitherto been performed.

Hitherto, common practice has been to make the semiconductor chip 3 smaller than the die pad 5. However, as shown in FIG. 2, there has recently arisen a case where a semiconductor chip is larger than a die pad. For this reason, the ability to ascertain the mounted position of a semiconductor chip without use of the edge of the semiconductor chip is of great significance, as in the case of the present embodiment.

So long as the size of a predetermined portion of the section is made equal to that of a positional deviation allowed on the basis of specifications and the position of a semiconductor chip is checked by means of observing a positional relationship between the predetermined portion and an electrode on the semiconductor chip, the mounted position of a semiconductor chip which is greater in width than the die pad can be readily checked.

Achievement of the foregoing effect does not always require that the mark 1 be a through hole; the mark 1 may be an indentation (hole) or a discernible thin-film pattern (e.g., having a different color). If the mark 1 is in the form of a through hole as in the present embodiment, there can be inhibited occurrence of air bubbles (i.e., well voids), which would otherwise arise when the semiconductor chip is packaged by injection of resin sealing material. Resin is usually less likely to flow along the edges of the semiconductor chip 3 (i.e., the left and right edges in the drawing), and hence air bubbles easily arise in resin. However, if a through hole is formed, as in the case of the embodiment, injected resin drops via the through hole, thereby preventing occurrence of air bubbles.

In the embodiment, the electrode 4 is utilized for ascertaining the position of the semiconductor chip 3 in the Y direction. However, there may also be employed a specific circuit pattern laid on the semiconductor chip 3 or another readily-discernible, characteristic portion of the same.

Needless to say, the mark 1 described in connection with the embodiment may be used for positioning the semiconductor chip 3 when the chip is mounted on the die pad 5, as well as for checking the mounted position of the semiconductor chip 3 during an inspection process.

Second Embodiment

Figure 3A:
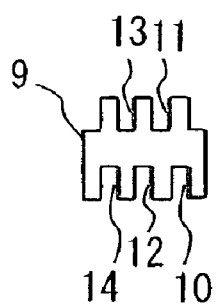
FIG. 3A shows a section according to a second embodiment.

A second embodiment relates to a mark, which is formed as a section of a lead frame, to be used for checking the mounted position of a semiconductor chip, wherein the mark has a comb-shaped geometry, such as that shown in FIG. 3A, which is a combination of a rectangle whose longitudinal direction is arranged in the X direction and a plurality of rectangles whose longitudinal directions are arranged in the Y direction. The greatest difference between the geometry of the mark 1 shown in FIG. 1A and the geometry of a mark 9 shown in FIG. 3A lies in that the mark 9 has a plurality of sides (10 through 14) capable of serving as sides for defining an allowable range. Hence, the positions of semiconductor chips of different sizes can be checked by use of a single mark.

Figure 3B:
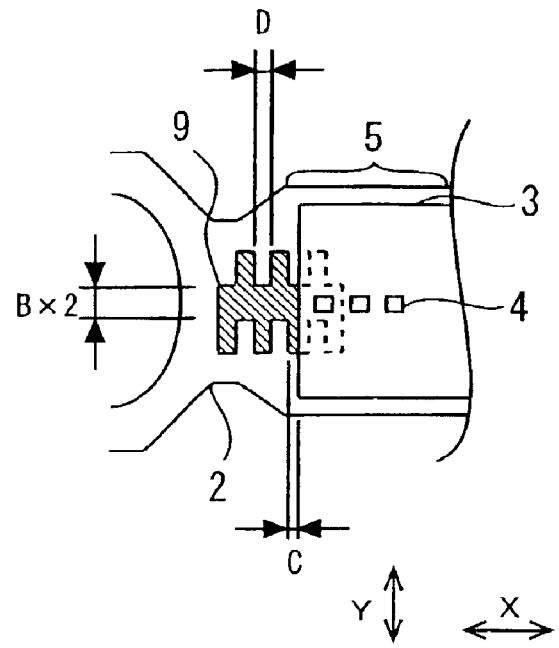
FIG. 3B is a plan view of the lead frame having the section in FIG. 3A.

FIG. 3B is a plan view showing the semiconductor chip 3 mounted on the lead frame 2 having the mark 9 formed therein. Positional deviation of a distance C in the X direction is allowed for the semiconductor chip 3. The side 12 of the mark 9 is arranged in line with the positional deviation limit of the semiconductor chip 3; that is, the left borderline of an allowable mount range. The side 14 of the mark 9 corresponds to the left borderline of an allowable mount range of another semiconductor chip which is larger than the semiconductor chip 3 and for which a positional deviation of distance D in the horizontal direction is allowed. Respective portions of the mark 9 are not always required to be of uniform size; the sizes may be determined in accordance with the size of a semiconductor chip to be mounted on a lead frame. The positions of the semiconductor chip 3 in the X and Y directions can be checked by means of the same method as employed in the first embodiment.

In the embodiment, since positions of semiconductor chips of different sizes can be ascertained by use of marks of a single type, there is no necessity of preparing lead frames which vary in accordance with the types of semiconductor chips, thus achieving economy.

As shown in FIG. 3A, if the mark 9 is formed such that shorter sides opposing each other with a long rectangle interposed therebetween in the X direction are provided in a staggered arrangement, a single mark 9 can be used commonly even when borderlines of allowable mount ranges of respective semiconductor chips are close to each other.

Third Embodiment

The first and second embodiments employ marks constituted of combination of rectangles. The mark according to the invention, which is formed as a section of a lead frame, is not always limited to geometries comprising combinations of rectangles. For example, the next embodiment employs a circular through hole as a mark.

Figure 4:
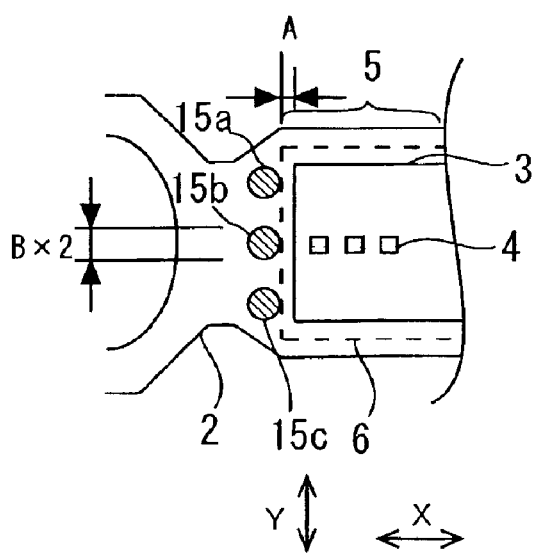
FIG. 4 is a plan view of the lead frame having sections according to a third embodiment.

FIG. 4 is a plan view of the semiconductor chip 3 mounted on the lead frame 2 having circular marks 15a, 15b, and 15c formed therein. The marks 15a, 15b, and 15c are circles whose radii correspond to an allowable positional deviation value B of the semiconductor chip 3 in the Y direction. The marks 15a, 15b, and 15c are provided side by side in the Y direction so as to be bounded by a borderline of the allowable mount range 6.

As in the case of the first and second embodiments, the position of the semiconductor chip 3 in the X direction is checked by means of the geometry of an observable portion of the marks 15a, 15b and 15c. The present embodiment involves the plurality of marks 15, 15b and 15c, and hence it is preferable to ascertain the geometry of each of the marks 15, 15b and 15c and a difference in geometries of the marks. For instance, if the semiconductor chip 3 is mounted in a rotated state (i.e., an inclined state) with the center thereof being aligned to a specified position, the center mark 15b will be viewed as a circle. However, in such a case, either the mark 15a or the mark 15c is viewed as an imperfect circle. Therefore, the inspection operator can readily detect that the semiconductor chip 3 is mounted in an inclined manner. Further, the mounted position of the semiconductor chip 3 in the Y direction can be checked, by means of determining whether or not the electrode 4 falls within a region whose width is equal to the diameter of the circle 15b.

As has been described above, in addition to the advantages described in connection with the other embodiments, the present embodiment further yields an advantage of the ability to comparatively readily detect an inclination of a semiconductor chip, by means of comparing geometries of observable portions of marks.

Figure 5:
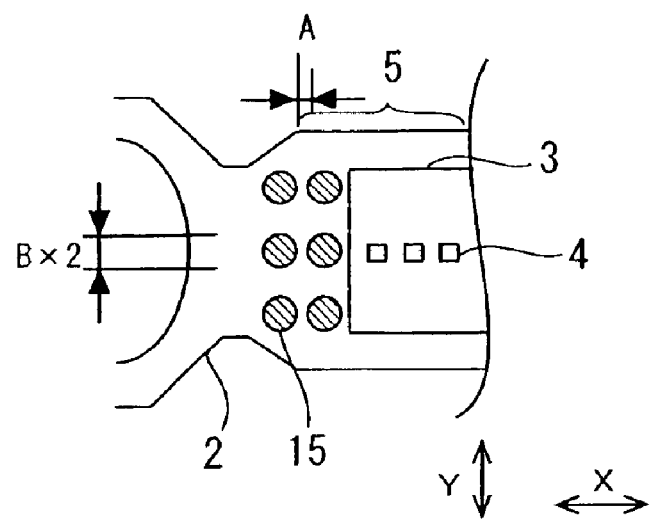
FIG. 5 shows another arrangement of the sections according to a third embodiment.

As shown in FIG. 5, marks of identical geometries may be arranged in two rows in the X direction. As a result, as in the case of the second embodiment, positions of semiconductor chips of different sizes can be checked by use of lead frames of a single type.

Other Embodiments

The three foregoing embodiments have been described as preferred embodiments of the invention. However, the geometry of the mark to be formed in a lead frame is not limited to those described in the embodiments. The geometry of the mark includes every possible pattern having predetermined geometries and areas. For example, there may be employed a simple geometry, such as a rectangle or an oval, or a pattern comprising a combination of rectangles other than the patterns described in connection with the previous embodiments.

Figure 6:
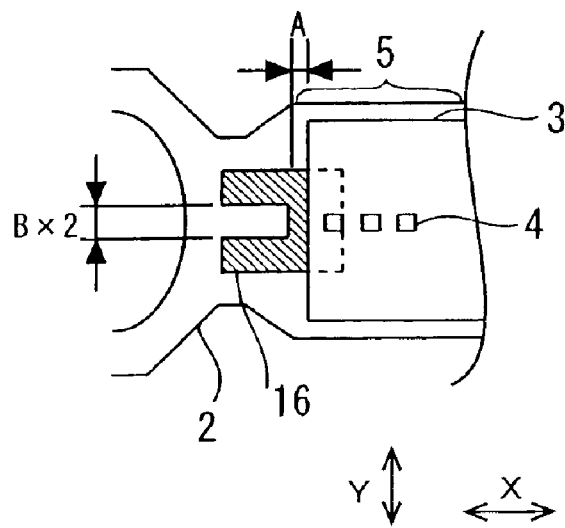
FIG. 6, FIG. 7 and FIG. 9 are a plan view of the lead frame having sections according to other embodiments of the present invention.
Figure 7:
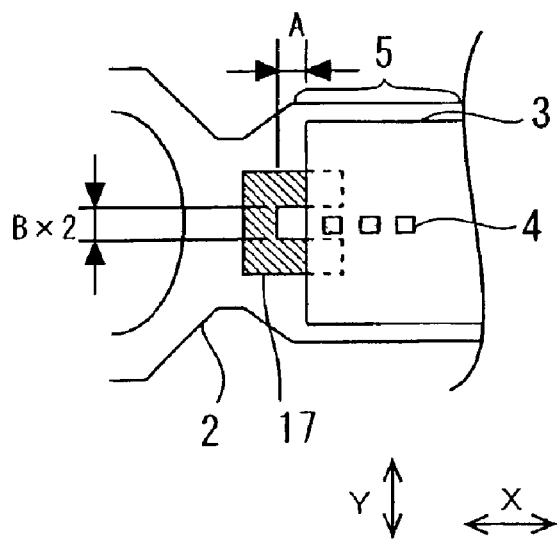
Figure 8A:
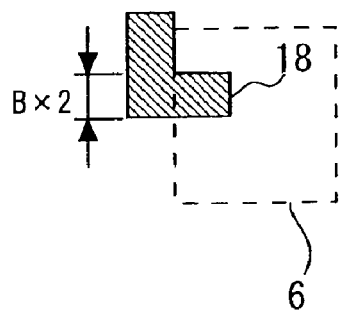
FIGS. 8A to 8D show sections according to other embodiments of the present invention.
Figure 8B:
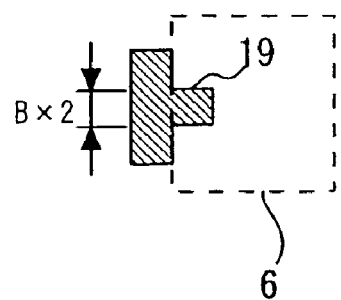
Figure 8C:
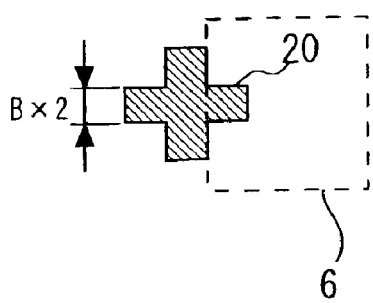
Figure 8D:
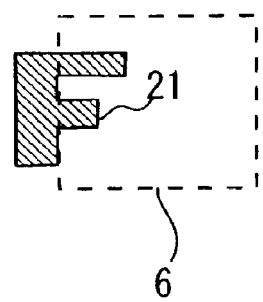

For instance, a conceivable geometry comprising a combination of rectangles includes a pattern of a reversed letter C shown in FIG. 6 or a pattern of the letter C shown in FIG. 7. Further, the conceivable geometry includes a pattern of the letter L shown in FIG. 8A and patterns produced by rotating the pattern shown in FIG. 8A through 90°, 180°, and 270°; a pattern of the letter T shown in FIG. 8B and patterns produced by rotating the pattern shown in FIG. 8B; a pattern of cross-hair shape shown in FIG. 8C; and a pattern of the letter F shown in FIG. 8D.

So long as a geometry formed of a combination of rectangles is arranged such that a junction between a rectangle extending in the X direction and another rectangle extending in the Y direction is aligned with a borderline of an allowable mount range, one of the rectangles will disappear if a semiconductor chip is mounted outside an allowable mount range. Thus, a great change arises in the geometry, thereby facilitating discernment of a positional deviation of the semiconductor chip.

Figure 9:
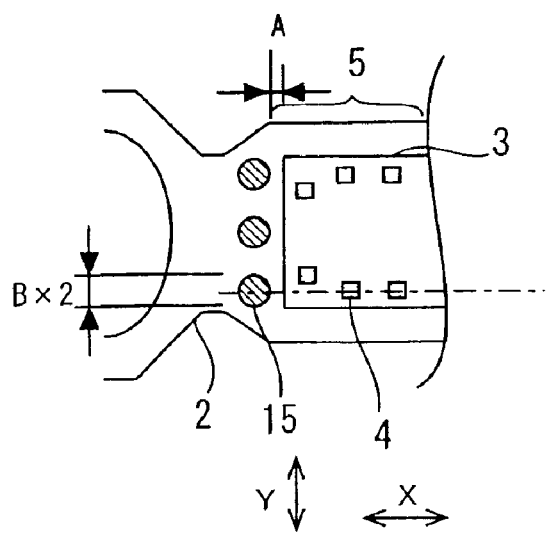
Figure 10:
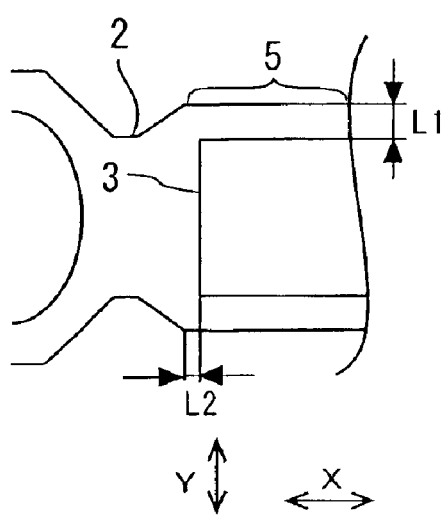
FIG. 10 is a view for describing the conventional determination method.

An arrangement of patterns or electrodes is not limited to those described in the embodiments. For example, in the case of the embodiment shown in FIG. 9, an electrode disposed near the edge of a chip may be used for positional check.

If the lead frame set forth is used, the accuracy of the mounted position of a semiconductor chip can be enhanced, and hence a higher-quality semiconductor device can be provided.

It is further understood that the foregoing description is a preferred embodiment of the invention and that various changes and modifications may be made in the invention without departing from the spirit and scope thereof.

The entire disclosure of a Japanese Patent Application No.2001-299162, filed on Sep. 28, 2001 including specification, claims drawings and summary, on which the Convention priority of the present application is based, are incorporated herein by reference in its entirety.

What is claimed is:

1. A lead frame comprising: a die pad on which a semiconductor chip is to be mounted, wherein the die pad comprises one or more sections in a certain shape or shapes which have predetermined geometry and area, said section used as a mark or marks to check a mounted position of the semiconductor chip.

2. The lead frame according to claim 1, wherein the section is formed as a through hole.

3. The lead frame according to claim 1, wherein the section has a portion which is equal in size with a positional deviation allowed for the semiconductor chip on the lead frame on the basis of predetermined specifications.

4. The lead frame according to claim 1, wherein
an allowable range for mounting the semiconductor chip determined in accordance with predetermined specifications is defined on the lead frame; and
the section is arranged outside the allowable range so as to be bordered by a borderline of the allowable range.

5. The lead frame according to claim 1, wherein
an allowable range for mounting the semiconductor chip determined in accordance with predetermined specifications is defined on the lead frame; and
the section is arranged, outside the allowable range or on a borderline of the allowable range, such that at least one of sides constituting the section is coincide with the borderline.

6. The lead frame according to claim 4, wherein the sections are arranged in a row or rows in a direction of the borderline of the allowable range.

7. The lead frame according to claim 4, wherein the sections are arranged in a row or rows in a direction perpendicular to a direction of the borderline of the allowable range.

8. The lead frame according to claim 1, wherein the section comprises a first rectangular portion and a second rectangular portion, in which the first and second rectangular portions are combined together such that long sides of the rectangular portions form a right angle.

9. The lead frame according to claim 8, wherein the section further comprises:
a third rectangular portion, in which a long side of the third rectangular portion is oriented in the same direction as that of the long side of the first rectangular portion and such that the long side of the third rectangular portion forms a right angle with a long side of the second rectangular portion.

10. The lead frame according to claim 1, wherein the section comprises:
a first rectangular portion;
a row of second rectangular portions which are formed so as to project from a first long side of the first rectangular portion in a direction perpendicular to the first long side; and
a row of third rectangular portions which are formed so as to project from a second long side of the first rectangular portion in a direction perpendicular to the second long side, wherein
the row of second rectangular portions and the row of third rectangular portions are laid in a staggered arrangement with the first rectangular portion interposed therebetween.

11. The lead frame according to claim 5, wherein the section has geometry of the letter H formed by a combination of rectangles.

12. The lead frame according to claim 5, wherein the section has comb-shaped geometry formed by a combination of rectangles.

13. The lead frame according to claim 4, wherein the section has geometry of a circle whose radius corresponds to an allowable positional deviation value of the semiconductor chip.

14. The lead frame according to claim 6, wherein the sections have geometry of circles whose radii correspond to an allowable positional deviation value of the semiconductor chip.

15. The lead frame according to claim 7, wherein the sections have geometry of circles whose radii corresponds to an allowable positional deviation value of the semiconductor chip.

* * * * *